US012660117B2

(12) United States Patent (10) Patent No.: US 12,660,117 B2

Rafalowski et al. (45) Date of Patent: Jun. 16, 2026

(54) PCB HOUSING AND ASSEMBLY METHOD THEREFOR

(71) Applicant: Aptiv Technologies AG, Schaffhausen (CH)

(72) Inventors: Arkadiusz Rafalowski, Brzezinka (PL); Janusz Duralek, Krynica Zdroj (PL); Pawel Hebda, Cracow (PL)

(73) Assignee: Aptiv Technologies AG, Schaffhausen (CH)

( * ) Notice: Subject to any disclaimer, the term of this patent is extended or adjusted under 35 U.S.C. 154(b) by 73 days.

(21) Appl. No.: 18/668,594

(22) Filed: May 20, 2024

(65) Prior Publication Data

US 2025/0203798 A1 Jun. 19, 2025

(30) Foreign Application Priority Data

Dec. 15, 2023 (EP) .................................... 23217328

(51) Int. Cl.
*H05K 7/14* (2006.01)

(52) U.S. Cl.
CPC .................................. *H05K 7/1427* (2013.01)

(58) Field of Classification Search
CPC ...... H05K 7/1427; H05K 5/0217; H05K 1/02; G03B 17/02; G03B 30/00; H04N 23/51; H04N 23/54; H04N 23/55; H04N 23/57
See application file for complete search history.

(56) References Cited

U.S. PATENT DOCUMENTS

| | | | |
|---|---|---|---|
| 8,817,481 B2 * | 8/2014 | Blake, III | B29C 66/114 |
| | | | 361/752 |
| 9,017,091 B2 * | 4/2015 | Zhu | H01R 13/512 |
| | | | 439/352 |
| 9,491,342 B2 | 11/2016 | Winter | |
| 9,565,342 B2 | 2/2017 | Sauer | |
| 9,621,769 B2 | 4/2017 | Mai | |
| 10,251,297 B2 * | 4/2019 | Manushi | H05K 5/0047 |

(Continued)

FOREIGN PATENT DOCUMENTS

| | | |
|---|---|---|
| EP | 4064678 A1 | 9/2022 |
| EP | 4287608 A1 | 12/2023 |
| EP | 4290850 A1 | 12/2023 |

OTHER PUBLICATIONS

Extended European Search Report for EP23217328.6, dated May 17, 2024, 9 pages.

(Continued)

*Primary Examiner* — Padma Haliyur

(74) *Attorney, Agent, or Firm* — Miller Johnson

(57) ABSTRACT

A printed circuit board (PCB) housing includes a main body and a cover. The main body includes an opening with an uppermost edge surface and an internal PCB receiver portion for locating and accommodating a PCB within the main body. The cover is for interfacing with an outer edge surface of the opening and enclosing the PCB within the main body. The cover includes a PCB retainer configured for contacting against a surface of the PCB such that, when assembled, the PCB is retained securely in position between the PCB receiver portion and the PCB retainer. The cover includes an outwardly extending resilient flange or bridge configured for covering the opening of the main body to press against the edge surface for welding thereto under tension.

12 Claims, 2 Drawing Sheets

(56)                References Cited

U.S. PATENT DOCUMENTS

| 10,477,080 | B2 | 11/2019 | Kunze | |
| 10,560,613 | B2 | 2/2020 | Conger | |
| 10,715,708 | B2 * | 7/2020 | Kim | H04N 23/55 |
| 2005/0048850 | A1 | 3/2005 | Zoller | |
| 2017/0310863 | A1 * | 10/2017 | Wöhlte | H04N 23/57 |
| 2018/0177067 | A1 * | 6/2018 | Manushi | H05K 1/181 |
| 2020/0076994 | A1 * | 3/2020 | Kunze | H04N 23/51 |
| 2021/0206329 | A1 * | 7/2021 | Hamlin | B60R 11/04 |
| 2023/0074986 | A1 * | 3/2023 | Niu | H05K 1/0206 |
| 2023/0168567 | A1 | 6/2023 | Elly | |
| 2023/0328890 | A1 * | 10/2023 | Angier | H05K 1/147 |
| | | | | 348/148 |
| 2023/0339412 | A1 * | 10/2023 | Achenbach | H05K 7/2039 |
| 2023/0363095 | A1 * | 11/2023 | Homutescu | H05K 5/15 |
| 2023/0397347 | A1 * | 12/2023 | Olivia | H05K 5/006 |

OTHER PUBLICATIONS

Extended European Search Report for EP22215705.9, dated Jun. 5, 2023, 11 pages.

* cited by examiner

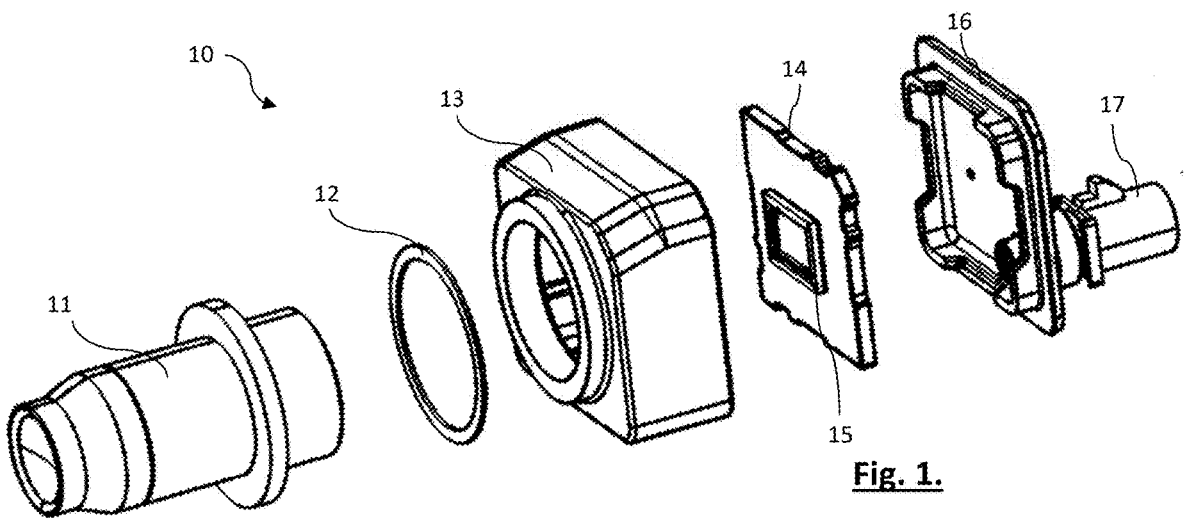
Fig. 1.
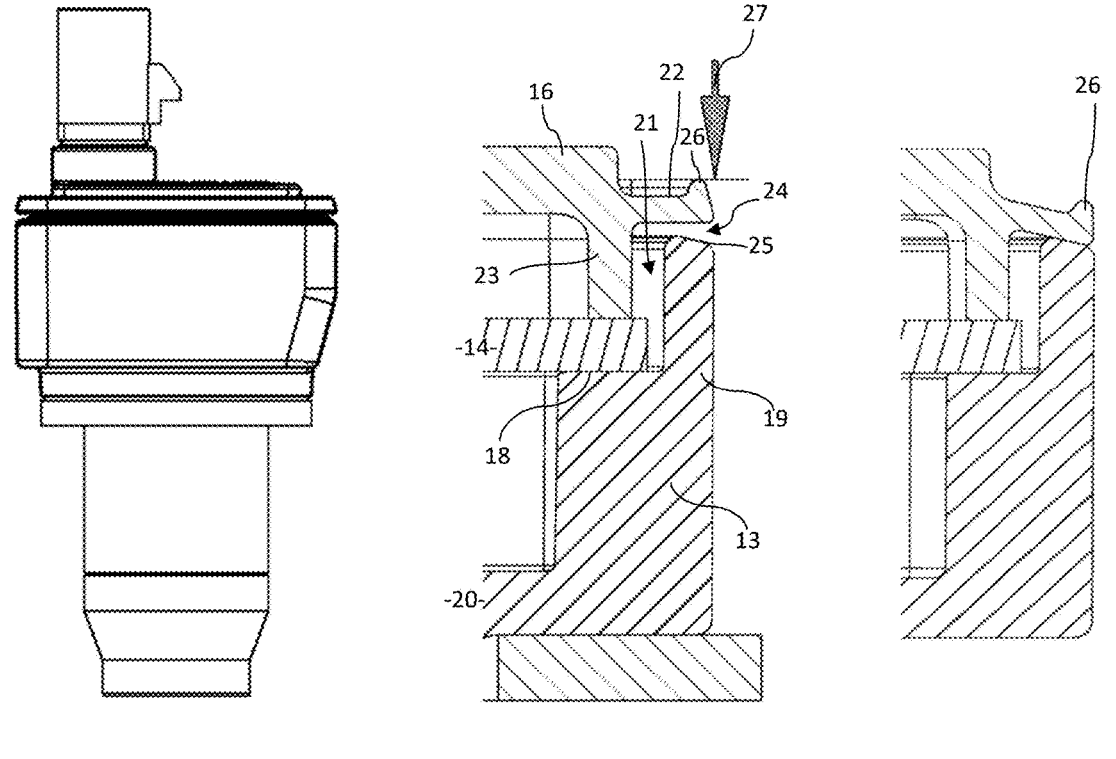
Fig. 2.                    Fig. 3.                    Fig. 4.

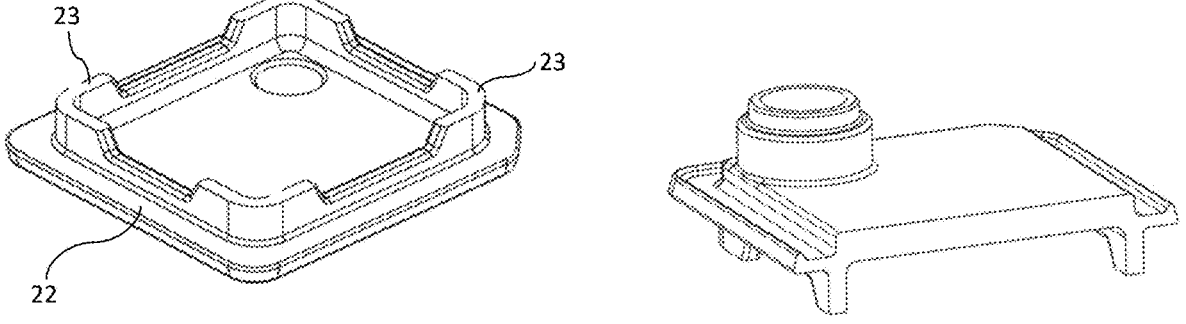
Fig. 5.                                    Fig. 6.
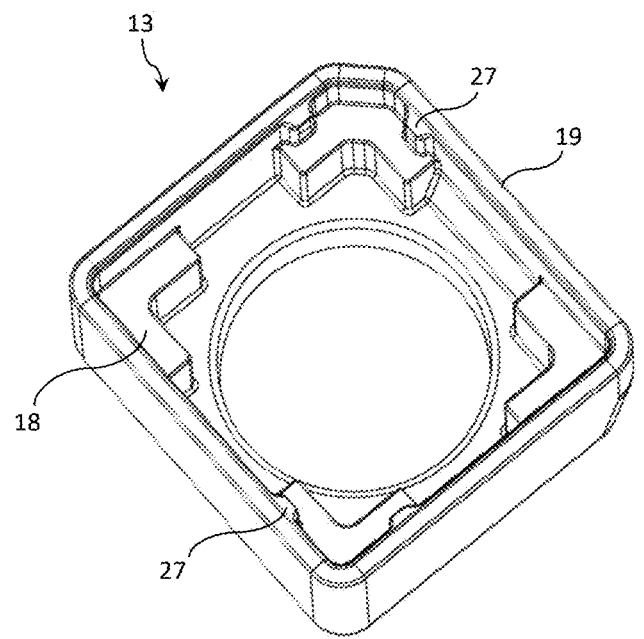
Fig. 7.

PCB HOUSING AND ASSEMBLY METHOD THEREFOR

CROSS-REFERENCE TO RELATED APPLICATIONS

This application claims priority to EP 23 217 328 filed Dec. 15, 2023, the entire disclosure of which is incorporated by reference.

FIELD

The present disclosure relates to a printed circuit board (PCB) housing and a method for assembling same. The PCB may be configured to mount a sensor, such as an image sensor/camera, to be accommodated within the housing.

BACKGROUND

Printed Circuit Boards (PCBs) are commonly found within electronic devices, e.g. in the automotive field and other applications. In practice, a PCB is often assembled into a protective housing. A particular example is that of an automotive camera, i.e. an imager located upon a PCB that is assembled into a housing associated with a lens and electrical connections thereto.

Known assembly processes for a PCB housing present challenges, such as a need to maintain manufacturing tolerances, e.g. along an assembly direction and laterally thereof. Furthermore, any deformation and strain on the PCB during and after assembly can cause problems that result in a proportion of the assembled devices being damaged or unsuitable for use. A higher bill of materials and process cost may often result.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

In light of the above, the present invention seeks to provide an improved PCB housing/assembly and an improved method/process for its construction that addresses the above issues, particularly seeking to reduce the occurrence of PCB deformation or strain, thereby providing an improved PCB arrangement.

A first aspect of the invention is outlined according to claim 1 of the appended claims. For example, a housing for housing a PCB is provided, the housing comprising: a cover/lid; and a housing main body. The body has side walls, forming an opening, configured for coupling to the cover to substantively form the PCB housing/enclosure. Notably, the cover and the housing main body effectively comprise first and second corresponding coupling members configured to provide a two-part enclosure for a PCB.

The cover comprises a PCB retainer or contact portion and the housing body comprises a corresponding PCB receiver/contact portion, configured such that when the cover is coupled to the housing body, the PCB is retained in position securely therebetween. The cover further comprises a peripheral flange or bridge configured to cover the opening of the main body, for pressing against edges of the upstanding walls and welding thereto under tension. Specifically, the outwardly extending resilient flange or bridge is configured for contacting against an uppermost edge surface of the opening and welding thereto under tension. The bridge contacts and does not extend beyond the substantive edge of the opening.

Tension for holding the PCB in position is provided by virtue of the height of the retainer maintaining the flange at a gap above the walls/opening of the main body. In this way, when the flange is pressed and resiliently flexes to contact the opening, where it is welded thereto, an inherent clamping force is produced onto the PCB by the retainer.

In this way, the cover and housing body cooperate to retain the PCB within the housing between opposing forces supplied by the retainer/receiver contact portions. The PCB is retained securely and evenly, while being protected from any undesirable forces.

As mentioned, the cover may comprise a cover connection member (i.e. the flange/bridge) and the body comprises a contact surface (e.g. edges of the opening/side walls) against which the cover/flange may be clamped for bonding, thus forming the PCB housing with a PCB retained therein. The contact surface/opening provides a delimiting opposing force during clamping as the resilient bridge is displaced/clamped thereto for bonding (e.g. welding). The contact surface of the main body with the bridge is the edge of an upstanding wall that may be provided with an angle/chamfer. In this way, as the bridge is bent/displaced during the clamping process, the contact edge may become parallel therewith to maximize the contact area for welding. In other words, the chamfer angles in an outward direction from the opening for accommodating the flange or bridge bending toward the edge surface.

In particular, by incorporating a novel cover bridge design, it is possible to reduce the overall housing size (i.e. a camera unit may be smaller compared to earlier designs). Furthermore, the risk of full remelting and PCB contamination is reduced.

In embodiments, provision of a rib extending upwardly from the cover flange/bridge may facilitate tool positioning, such that tolerances are not critical while the cover is positioned on the housing.

In embodiments, provision of an "L" shape PCB support surface at the cover and main body, reduces corresponding deformation and strain on the PCB.

The contact and welding area of fixing is provided at locations spaced apart and separate from the locations at which the PCB is retained.

Advantageously, the two-part coupling arrangement provided for by the configuration of both housing body and the cover provides for an accuracy in locating the PCB within the housing, and a secure retention of the PCB while protecting the PCB for any non-desired forces that might arise during assembly. Further, the arrangement allows for accuracy of location of the corresponding retainer and receiver with the PCB internally within the housing, as guided and controlled by the location of the mating/connection members at the external portion of the housing. Finally, fixing forces relating to the assembly or fixing of the housing are directed through the connection members and not to the PCB. As such, the PCB is not subject to additional forces during fixing. However, when the housing parts are engaged, retention forces acting between the housing and PCB provide for a positive engagement of the PCB with the receiver and retainer. The retention forces are controlled by the configuration that provides a receiver of depth corresponding to that of the PCB and just less than the height of the retainer. As the connection between the cover and body is closed the receiver and retainer are urged together with the PCB therebetween.

According to an embodiment, the PCB receiving surface/ledge of the main body and the upstanding retainer of the cover are configured to engage the PCB simultaneously about its peripheral edge. As mentioned, provision of "L" shaped PCB support surfaces/contact portions at corners corresponding to the upper and lower surfaces of the PCB periphery facilitate management of forces/stress on the PCB.

Advantageously, arrangements described herein allow for the PCB to be retained with precision at a required transverse orientation and vertical level within the housing. Contact with the receiver and the retainer may be limited to defined areas of the PCB. The arrangement of the receiver and the retainer and the control of forces applied at their interface with the PCB avoids application of uneven forces that might cause strain at certain areas of the PCB or affect the plane of orientation of the PCB, which could, in turn, reduce the accuracy of the location of components on the PCB relative to other component mounted to the housing. The arrangement is such that the PCB is maintained with precision in the required transverse (for example X-Y) plane at the required vertical level (for example Z) within the housing. The PCB is maintained in a horizontal orientation relative to the housing and components connected to the housing.

According to the embodiments herein, the PCB is protected from forces that might otherwise be caused during assembly of a PCB into a housing. Instead, the retention force is a controlled force limited such that a positive contact is provided at the contact surfaces adjacent to the PCB but additional forces are not applied or transmitted from other parts of the housing to the PCB.

The receiver portion and retainer element are configured such that the respective contact surfaces are spaced apart to accommodate the PCB without exerting undue force on the substantive PCB. Particularly, the cover and hence its retainer is clamped, thereby transferring force to edges of the PCB, but such force is up to a limit determined by the maximum displacement of the resilient bridge against the contact surface of the main body sidewalls/opening.

In other words, the cover connection member (i.e. flange/bridge) and the body connection member (i.e. upstanding main body wall) are located externally to and spaced apart from the PCB receiver (e.g. a ledge within the main body) and retainer (e.g. upstanding element of the cover facing into the main body during assembly) such that forces required to fix the cover to the body are directed to the connection members at locations offset from the PCB itself.

In various embodiments, by virtue of the configuration of the housing components, forces acting to retain the PCB in the receiver act in the vertical direction relative to the housing in the direction of interfaces of the retainer with the PCB and the PCB with the receiver. The clamping force for assembling the housing is directed at a portion of the housing (vertical axis) that is offset from the retainer and receiver longitudinally and/or laterally. Optionally, the connection members may be located spaced apart in longitudinal and/or lateral directions relative to the receiver and retainer.

According to an assembly method, the cover connection member/bridge is displaced under the application of force to bring it into engagement with the connection member of the housing for fixing thereto.

In an example arrangement, the cover connection member is comprised of a peripherally located flange or bridge portion that is configured to be displaceable relative to the other (inboard) portions of the cover such as the retention wall/element and a central cover portion.

The cover connection member is also displaceable relative to other portions of the housing body including the side wall at which it is connected. When a fixing force is applied the cover connection member, configured by virtue of its location and properties, moves under the fixing/clamping force into engagement with the connection member/surface of the main body.

The connection surface/area of the body connection member defines a stop or abutment surface(s) that prevents further movement of the flange relative to the body. The fixing force which acts to deform and displace the connection member is accordingly directed to and predominantly acts on the connection members only. The stop (i.e. edge of main body peripheral wall/opening) is offset in the vertical direction relative to the contact surface of the receiver by a distance corresponding to the depth of the PCB plus a height to accommodate the retention element of the cover.

According to an assembly process described herein, of a first part of the two-part coupling of the cover and housing, the first and second coupling members of cover and housing are brought into alignment and located in a first pre-fixing position. In the first pre-fixing position the PCB is located within the receiver such that a contact portion of a receiver-facing surface of the PCB is engaged in contact therewith, and the retainer is arranged in contact with a contact portion of an opposite, i.e. retainer-facing, surface of the PCB. Furthermore, at least one positioning element or rib may extend from an internal wall of the main body, adjacent the PCB receiver, to locate the PCB itself and retainer of the cover, so that the peripheral shape of the cover aligns/matches the opening of the main body.

In a various form, in the first pre-fixing position the connection member of the cover is located offset in transverse (for example X-Y) and vertical (for example Z) directions relative to the retainer of the cover, and the connection member (e.g. edge of upstanding wall) of the body is located offset in transverse (X-Y) and vertical (Z) directions relative to the receiver (e.g. inner ledge).

In both the first pre-fixing and a second (fixing) position, the connection member (e.g. peripheral flange/bridge) of the cover is located at a different vertical level relative to the Z direction of the retainer. The cover connection member is configured to move relative to other portions of the housing under the application of force to allow it to be located for fixing to the body connection member.

The cover connection member/bridge is configured to be displaced in the vertical direction relative to the other parts of the cover and housing for fixing. Further, in a various form, the cover and body are configured such that, in the pre-fixing position, the PCB is retained in positive contact with both the receiver and the retainer. The receiver and retainer may have a generally quadrilateral configuration or similar form that corresponds to the form and peripheral shape of the PCB, and together define a frame that retains the PCB by engaging a peripheral portion of the PCB around the sides of the PCB. However, as mentioned, the corners of the retainer and receiver may provide the contact points onto respective surfaces of the PCB. In an alternative form, the contact surfaces may be interposed between the corners.

According to the foregoing, the PCB is securely and evenly retained, where forces between the contact surfaces of the receiver and retainer and the peripheral contact surface portions of the PCB are applied evenly and dispersed. A relatively large or at least ample surface area of contact is provided between the PCB and the housing. The retainer and receiver co-operate to locate the PCB, within manufacturing tolerances, at a required transverse orientation and at a required vertical level within the housing. The PCB is held stably within the housing, while being protected from undesired forces.

Advantageously, the connection members brought into engagement are arranged to be fixed at a connection interface between the cover and body. The connection member of the cover is displaceable in a vertical direction parallel to the central vertical axis of the housing. A rib extending from the connection member/flange in a direction opposition to the body-facing/bonding area direction, provides a contact surface for a pressing tool to engage and apply force in a vertical direction. In other words, the movement and connection for fixing is directed in generally vertical directions and planes. By virtue of a rib at the cover perimeter, the pressing tool tolerance position during welding process is not critical.

As the connection member of the cover is already aligned with the connection member of the body and displaced from the receiver, forces are not exerted in transverse directions from the external wall towards the receiver. The fixing forces act in vertical directions between the connection members only. There is no transverse squeezing or outward force.

According to an alternative expression of the invention, a PCB housing may comprise a cover for bonding to the peripheral side wall of a main body. The peripheral side wall defines at least a first inner recess featuring a PCB receiving surface and an outer edge defining a connection surface to interface with a peripheral portion of the cover. The main body may comprise second or further recesses.

According to an embodiment, the first inner recess is located offset in the vertical direction relative to the outer edge by a distance generally greater than the depth of the PCB to be located between a retainer element of the cover extending into the inner recess and the receiving surface of the housing. Particularly, the depth of the PCB receiver surface is configured to provide control of forces between the housing, cover and PCB. The retainer height must maintain the cover and its resilient edge at a gap from the main housing body during pre-fixing. The gap is then closed during assembly when the cover edge/flange is welded to the housing opening.

It will be apparent that the cover is configured for aligning/mating with the main housing body and may comprise: a central cover portion and a peripheral cover portion (e.g. edge) extending and terminating in a lateral plane about the central cover portion; at least one retainer element extending from the cover, inboard of the peripheral edge/cover portion, that is in a direction toward the housing body (when in use). At least the peripheral cover portion may be formed of resilient material configured to flex/deform toward the housing body during a pressing/bonding process.

According to above, the peripheral cover portion defines the connection member of the cover, the connection member being configured such that the application of an external force thereto provides for movement of the connection member relative to other center and retainer portions to, in use, bring the connection member into engagement with the connection member of the body.

According to a further aspect there is provided a method for assembly of a PCB housing to provide a controlled location and retention of a PCB for operation. The method comprises: providing a housing as disclosed above; locating a PCB into or against the housing receiver (e.g. first inner recess); locating the cover and main body in a pre-fixing position, e.g. where the flange/bridge is coincident with an outermost side wall of the main body; applying a fixing force causing displacement of the flange/bridge into contact with the housing body; and fixing the cover to the body, e.g. by ultrasonic welding.

Advantageously, the housing is configured such that the resultant forces acting between the two housing parts provides for a retention force sandwiching the PCB between the housing body and cover to retain the PCB in position, as required. The various arrangements and embodiments of the disclosure herein provide explanatory guidance for implementation of the invention.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

FIG. 1 illustrates an overview of a PCB housing, in the form of a camera assembly.

FIG. 2 illustrates a side view of the PCB housing, in a first step of assembly, prior to bonding.

FIG. 3 illustrates a cross section view of the housing, in the first step of assembly.

FIG. 4 illustrates a cross section view of the housing, in a second step of assembly where bonding takes place.

FIG. 5 illustrates an underneath view of the cover.

FIG. 6 illustrates a partial overview of the cover, where a cross section is visible.

FIG. 7 illustrates an overview inside of the main body of the housing.

In the drawings, reference numbers may be reused to identify similar and/or identical elements.

DETAILED DESCRIPTION

The following description presents various embodiments and, together with the drawings, serves to explain principles of the invention. However, the scope of the invention is not intended to be limited to the precise details of the embodiments or exact adherence with all features and/or method steps, since variations will be apparent to a skilled person and are deemed also to be covered by the description. Terms for components used herein should be given a broad interpretation that also encompasses equivalent functions and features. In some cases, several alternative terms (synonyms) for structural features have been provided but such terms are not intended to be exhaustive. Descriptive terms should also be given the broadest possible interpretation; e.g. the term "comprising" as used in this specification means "consisting at least in part of" such that interpreting each statement in this specification that includes the term "comprising", features other than that or those prefaced by the term may also be present. Related terms such as "comprise" and "comprises" are to be interpreted in the same manner. Directional terms such as "vertical", "horizontal", "up", "down", "sideways", "upper" and "lower" are used for convenience of explanation usually with reference to the orientation shown in illustrations and are not intended to be ultimately limiting if an equivalent function can be achieved with an alternative dimension and/or direction. Indeed, in the present case a term such as "horizontal" axis or "vertical" axis can be affected by the orientation imposed on the housing structure. Therefore, all directional terms are relative to each other.

The description herein refers to embodiments with particular combinations of steps or features, however, it is envisaged that further combinations and cross-combinations of compatible steps or features between embodiments will be possible. Indeed, isolated features may function independently as an invention from other features and not necessarily require implementation as a complete combination.

It will be understood that the illustrated embodiments show applications only for the purposes of explanation. In practice, the invention may be applied to many different configurations, where the embodiment is straightforward for those skilled in the art to implement.

FIG. 1 shows a general view of components for a camera assembly, serving as an example of a printed circuit board (PCB) housing according to the invention. The assembly 10 includes a lens barrel 11, a sealing gasket/ring 12, a main housing body 13, a printed circuit board, PCB 14, upon which is located an imager chip 15, a cover 16 to complete enclosure of the PCB 14 into housing 13, and a connector 17. Details of the connector 17, lens barrel 11 and imager 15 will not be discussed further herein, since the disclosure relates to features employed in coupling cover 16 with housing body 13, while retaining PCB 14.

FIG. 2 shows a partially assembled external view of the housing 13 with cover 16 while FIG. 3 shows a cross-section view where internal details of the cover 16 and main body 13 are apparent. Specifically, PCB 14 is inserted into main body 13 to be positioned in a transverse location upon a ledge 18 that serves as a PCB receiver surface. Ledge 18 forms a first recess inside housing 13, and may be an annular surface about an internal bore within housing 13. As shown, body 13 is generally comprised of an external side wall 19 which provides the substantive externally visible structure, upstanding from a base area 20. An uppermost portion of wall 19 forms an opening 21 to the housing which, during assembly, is closed/capped off by cover 16.

Cover 16 also includes several surface features, notably a connection portion 22 in the form of a flange or bridge piece which comprises the peripheral edge of cover 16, i.e. surrounding a central portion thereof. Bridge 22 extends laterally to terminate in an outermost edge which is generally within the same plane as the central portion of cover 16. In the illustrated form bridge 22 generally has a reduced thickness compared to the central portion 16 so that it is flexible during a pressing step as will be described further below.

A PCB retainer 23 extends downwardly from the cover 16 into the opening 21 to contact the PCB, e.g. at an upper surface proximate an outer edge thereof. According to both FIGS. 2 and 3, retainer 23 holds the cover 16 at an elevation just above opening 21 where a gap 24 is present between a flat lower surface of bridge 22 and a terminal end 25 of wall 19. End/edge 25 may feature an angled (e.g. beveled or chamfered) configuration so that it allows for a corresponding flex angle of bridge 22 during fixing. The chamfer angles downwardly in the illustrated view, from the interior of the main body toward the exterior.

An upstanding rib 26, proximate the outer edge of bridge 22, is provided to facilitate contact with a pressing tool during the assembly process. Rib 26 may extend around the perimeter of bridge 22 or be intermittent so long as a minimum proportion is covered.

FIGS. 5 and 6 show the surface features of cover 16 in further detail. Particularly, it will be apparent that PCB retainer 23 may be formed as an upstanding wall from an underside of cover 16 where the greatest height, for contact with PCB 14, is at the corners. In other words, retainer 23 may be comprised of four L-shaped contact points which correspondingly face and contact respective corners of the PCB.

FIG. 7 shows a view inside main body 13 where, coinciding with the four L-shaped contact points of retainer 23, the PCB receiver, i.e. ledge 18, is also comprised of four L-shaped surfaces. In this way, the PCB (not shown in FIG. 7) is sandwiched/pinched at its corners only between retainers 23 and receivers 18.

Additionally, FIG. 7 shows a guide surface or ribs 27 protruding from diagonal internal corners of housing 13, proximate the receiving ledges 18. Such a guide helps to position both a corner of the PCB (which may have cut outs as shown in FIG. 1 to accommodate the guides 27) and the corresponding L-shaped retainer 23. A guide element generally assists in aligning cover 16 into opening 21.

An assembly method will now be described, particularly with reference to FIGS. 3 and 4 which respectively show a pre-fixing and fixing step.

FIG. 3 shows the PCB housing in a pre-fixing assembly state, namely where a PCB 14 has been installed into the housing, supported by ledge 18 of the PCB receiver, followed by insertion of the retainer(s) 23 of the cover 16 into the housing to contact against and be supported by the PCB 14. The height of the retainer 23 is such that the peripheral edge/flange 22 of the cover is suspended above opening 21 by a gap 24, distanced from edge 25 of side wall 19. In a resting state of FIG. 3 there is no force applied to PCB or any other component.

Still with reference to FIG. 3, a pressing force, supplied by a tool (not visible), is applied by the representative arrow 27 against bridge 22 via rib 26. A contacting surface of the tool may be relatively flat and horizontal but, by virtue of rib 26, the pressing force is applied to an optimal location proximate an outermost edge of bridge 22.

Since cover 16 and bridge 22 may be formed in one piece of a resilient material such as a plastic, the bridge is able to flex toward the opening 21 and contact surface area 25 of the main body wall. FIG. 4 shows this second, fixing, state of assembly where the two housing parts 13 and 16 are able to be bonded together, e.g. by welding. Coupling between the parts is facilitated by the angled nature of edge 25, enabling a greater contact surface area and avoiding bending of bridge 22 about a second axis, which could occur if the edge 25 were horizontal.

It will be apparent that the process of using a pressing tool to apply force 27 to bridge 22 transfers a retaining force to PCB 14 via retainer 23. However, any additional force (beyond that needed to bend bridge 26 into position) is absorbed by main body 13 rather than transferred to PCB 14. Thus, PCB 14 is retained in place between retainer 23 and receiver 18 by a relatively predictable force.

When welded in place about its periphery, cover 16 is maintained securely as a closure to housing body 13 and prevents ingress of contaminants, etc.

In consideration of the above, the PCB housing described herein is able to accommodate a required PCB clamping force with a cover wall thickness that does not need to be reduced to a minimum, along with a relatively short bridge length. In other designs a thin wall may cause process challenges during the welding operation. Full wall remelting could be a source of contamination. Additionally, by utilizing a rib on the bridge it is easier to control pressing fixture design position/tolerances at the required level. Finally, the design allows for symmetrical PCB support which avoids unnecessary PCB deformation.

According to the present disclosure, proper PCB clamping force can be ensured during and after the assembly process. There is no need for any additional features to join parts together (e.g. screw, glue, press-fits). Moreover, in the context of a camera, the PCB is clamped directly between the cover and the lens holder. The parts tolerances are compensated by design.

A primary advantage of the housing herein is provision of a deformable bridge area, e.g. a bridge that is much shorter and can have higher thickness than other designs. Furthermore, it has a special rib on the perimeter.

Shortening the bridge may result in a camera size being reduced, e.g. from 31×33 mm to 28×30 mm. By increasing material thickness at the welding area the risk of full remelting and consequently PCB contamination is reduced.

As mentioned, an extra rib at the cover perimeter, enables the pressing tool to less critical tolerance of position during welding process. Additionally, by defining a symmetrical "L" shape PCB support, any deformation caused during assembly or temperature load is symmetrical and is reduced. It is noteworthy that the PCB clamping force could be adjusted by cover geometry modification. In general, the greater the gap 24, the greater the force that will be applied for closure and transference to the PCB.

By way of summary, the invention is generally embodied by a PCB housing, e.g. for a camera module, that includes a main body and a cover. The cover includes a PCB retainer element configured for contacting against a surface of a PCB located into a receiving surface within the main body such that, when assembled, the PCB is retained securely in position (e.g. in x, y and z planes). An outwardly extending resilient flange of the cover interfaces with an uppermost edge surface of an opening to the main body, such that, when pressed by a pressing tool against and welded to the edge surface a force is maintained onto the PCB by the PCB retainer.

The term non-transitory computer-readable medium does not encompass transitory electrical or electromagnetic signals propagating through a medium (such as on a carrier wave). Non-limiting examples of a non-transitory computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The term "set" generally means a grouping of one or more elements. The elements of a set do not necessarily need to have any characteristics in common or otherwise belong together. The phrase "at least one of A, B, and C" should be construed to mean a logical (A OR B OR C), using a non-exclusive logical OR, and should not be construed to mean "at least one of A, at least one of B, and at least one of C." The phrase "at least one of A, B, or C" should be construed to mean a logical (A OR B OR C), using a non-exclusive logical OR.

The invention claimed is:

1. A printed circuit board (PCB) housing comprising:
a main body including an opening with an uppermost edge surface and an internal PCB receiver portion for locating and accommodating a PCB within the main body; and
a cover for interfacing with an outer edge surface of the opening and enclosing the PCB within the main body, wherein:
the cover includes a PCB retainer configured to contact against a surface of the PCB such that, when assembled, the PCB is retained securely in position between the PCB receiver portion and the PCB retainer,
the cover includes an outwardly extending resilient flange or bridge configured to cover the opening of the main body to press against and be welded to the uppermost edge surface under tension,
the uppermost edge surface of the opening includes a chamfer configured to optimize a contact area with the flange or the bridge, and
chamfer angles are positioned in an outward direction from the opening to accommodate the flange or the bridge bending toward the edge surface.

2. The PCB housing of claim 1 wherein the flange or the bridge includes a rib extending upwardly from the cover, away from the main body, for facilitating positioning of a pressing tool.

3. The PCB housing of claim 2 wherein the rib extends about a substantive perimeter of the flange or the bridge.

4. The PCB housing of claim 1 wherein the PCB receiver portion and the PCB retainer are configured to engage the PCB simultaneously and at least one peripherally located contact portion of upper and lower surfaces thereof.

5. The PCB housing of claim 4 wherein the PCB receiver portion and/or the PCB retainer includes at least one L-shaped element.

6. The PCB housing of claim 5 wherein the at least one L-shaped element includes four L-shaped elements corresponding to corner located contact portions of the upper and lower surfaces of the PCB.

7. The PCB housing of claim 1 wherein the flange or the bridge and the uppermost edge surface of the opening are located externally to and laterally spaced apart from the PCB receiver and the PCB retainer such that forces required to fix the cover to the body are directed at locations offset from the PCB.

8. The PCB housing of claim 1 wherein:
the PCB housing is a camera unit;
the PCB includes an imager; and
the main body is coupled with a lens barrel at an end opposite the cover and the opening.

9. A method of assembling a printed circuit board (PCB) housing, the method comprising:
locating a PCB onto a PCB receiver of a main body of the PCB housing such that the PCB receiver is in contact with a contact portion of a lower surface of the PCB;
aligning a cover of the PCB housing over a chamfered uppermost edge surface of an opening of the main body, thereby inserting a PCB retainer of the cover into the opening to achieve a pre-fixing position, wherein:
the PCB retainer is arranged in contact with an opposing contact portion of an upper surface of the PCB,
a gap is present between a bridge of the cover and the uppermost edge surface of the opening, and the chamfer of the chamfered uppermost edge surface is angled in an outward direction from the opening; and applying a vertical pressing force to a flange of the cover or the bridge to cause deformation thereof and to move the flange or the bridge into contact with the uppermost edge surface of the opening of the main body to achieve a fixing position.

10. The method of claim 9 further comprising: welding the bridge to the edge surface.

11. A printed circuit board (PCB) housing comprising:

a main body including an opening with an uppermost edge surface and an internal PCB receiver portion for locating and accommodating a PCB within the main body; and a cover for interfacing with an outer edge surface of the opening and enclosing the PCB within the main body, wherein:

the cover includes a PCB retainer configured to contact against a surface of the PCB such that, when assembled, the PCB is retained securely in position between the PCB receiver portion and the PCB retainer, the cover includes an outwardly extending resilient flange or bridge configured to cover the opening of the main body to press against and be welded to the uppermost edge surface under tension, the uppermost edge surface of the opening includes a chamfer configured to optimize a contact area with the flange or the bridge, chamfer angles are positioned in an outward direction from the opening to accommodate the flange or the bridge bending toward the edge surface, and the flange or the bridge includes a rib extending upwardly from the cover, away from the main body, for facilitating positioning of a pressing tool.

12. The PCB housing of claim 11 wherein the rib extends about a substantive perimeter of the flange or the bridge.

* * * * *